United States Patent
Reykowski

(10) Patent No.: US 10,302,716 B2
(45) Date of Patent: May 28, 2019

(54) DIGITAL RECEIVER COIL WITH BUILT-IN RECEIVED PHASE NOISE INDICATOR

(71) Applicant: KONINKLIJKE PHILIPS N.V., Eindhoven (NL)

(72) Inventor: Arne Reykowski, Eindhoven (NL)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 235 days.

(21) Appl. No.: 15/510,327

(22) PCT Filed: Sep. 16, 2015

(86) PCT No.: PCT/IB2015/057122
§ 371 (c)(1),
(2) Date: Mar. 10, 2017

(87) PCT Pub. No.: WO2016/046696
PCT Pub. Date: Mar. 31, 2016

(65) Prior Publication Data
US 2017/0299672 A1   Oct. 19, 2017

Related U.S. Application Data

(60) Provisional application No. 62/055,273, filed on Sep. 25, 2014.

(51) Int. Cl.
*G01R 33/36* (2006.01)
*G01R 33/56* (2006.01)
*G01R 33/567* (2006.01)

(52) U.S. Cl.
CPC ..... *G01R 33/3692* (2013.01); *G01R 33/5608* (2013.01); *G01R 33/5673* (2013.01)

(58) Field of Classification Search
CPC ....... G01R 33/36; G01R 33/56; G01R 33/567
See application file for complete search history.

(56) References Cited

U.S. PATENT DOCUMENTS 5,525,906 A   5/1996   Carwford et al.
7,560,933 B2  7/2009   Yoshizawa
(Continued)

FOREIGN PATENT DOCUMENTS

CN   103529409 A   1/2014

OTHER PUBLICATIONS

Valentina Hartwig et al: "A theory for the estimation of SNR degradation caused by clock jitter in MRI systems" Concepts in Magnetic Resonance Part B:Magnetic Resonance Engineering,vol. 31B, No. 1, Jan. 1, 2007 (Jan. 1, 2007), pp. 60-64.

*Primary Examiner* — G. M. A Hyder

(57) ABSTRACT

A system and method synchronizes a digitizer clock of a Magnetic Resonance Imaging (MRI) device with a system clock of an imaging device. In a first method, an original reference signal is split into first and second reference signals in which the second reference signal is phase shifted to generate an orthogonal reference signal. A reliability of image data may be determined based upon a product between the first reference signal and the orthogonal reference signal. In a second method, a reference signal is transmitted from the imaging device to the MRI device and a return signal is received from the MRI device to the imaging device. A discrepancy between the digitizer clock and the system clock may be determined based upon the return signal which includes a variable time delay.

10 Claims, 7 Drawing Sheets

(56) References Cited

U.S. PATENT DOCUMENTS

| | | |
|---|---|---|
| 8,244,192 B2 | 8/2012 | Prasidh et al. |
| 2010/0117649 A1 | 5/2010 | Nakanishi |
| 2010/0260293 A1 | 10/2010 | Roeven |
| 2010/0327940 A1 | 12/2010 | Eisenstadt et al. |
| 2011/0103491 A1 | 5/2011 | Saes et al. |
| 2011/0109316 A1 | 5/2011 | Akita et al. |
| 2011/0227574 A1* | 9/2011 | Akita ................. G01R 33/3692 324/322 |
| 2013/0127465 A1 | 5/2013 | Kwon |
| 2017/0176552 A1* | 6/2017 | Reykowski ........ G01R 33/3692 |
| 2018/0106875 A1* | 4/2018 | Duensing ........... G01R 33/3692 |

* cited by examiner

DIGITAL RECEIVER COIL WITH BUILT-IN RECEIVED PHASE NOISE INDICATOR

CROSS REFERENCE TO RELATED APPLICATIONS

This application is a U.S. national phase application of International Application No. PCT/IB2015/057122, filed on Sep. 16, 2015, which claims the benefit of U.S. provisional Application Ser. No. 62/055,273 filed on Sep. 25, 2014 and is incorporated herein by reference.

A magnetic resonance imaging (MRI) device is used to visualize internal structures of a body. Specifically, MRI makes use of the property of nuclear magnetic resonance (NMR) to image nuclei of atoms inside the body. A conventional MRI device includes a retractable patient table in which a patient lies. The patient is moved within the MRI device such that a large, powerful magnet generates a magnetic field that is used to align the magnetization of some atomic nuclei in the body, and radio frequency magnetic fields are applied to systematically alter the alignment of this magnetization. This causes the nuclei to produce a rotating magnetic field detectable by the scanner. This information is recorded to construct an image of the scanned area of the body.

The MRI device has had changes in its operation to improve efficiency in performing a scan. Specifically, the MRI device may include wireless coils that remove the requirement for cable connections. The wireless coils enable a significant work flow benefit as the need to connect and disconnect the cables is eliminated. The use of the wireless coils typically does not require any reduction in bore size of the MRI device such that an increased coil density may also be realized above conventional norms. However, in a substantially similar manner as with any wireless system, signal propagation may undergo various inadvertent effects such as phase error that may fundamentally change calculations being performed for the scan. In one example, a clock of the MRI device may not be properly synchronized with a system clock in which the calculations are based.

Accordingly, it is desirable to determine and/or synchronize a digitizer clock of the MRI device to more accurately perform the MRI scan. Thus, there is a need for a system that provides an indication or a fixed signal for the scan to be performed.

The exemplary embodiments relate to a system and method for [to be inserted]. The method comprises [to be inserted].

Figure 1:
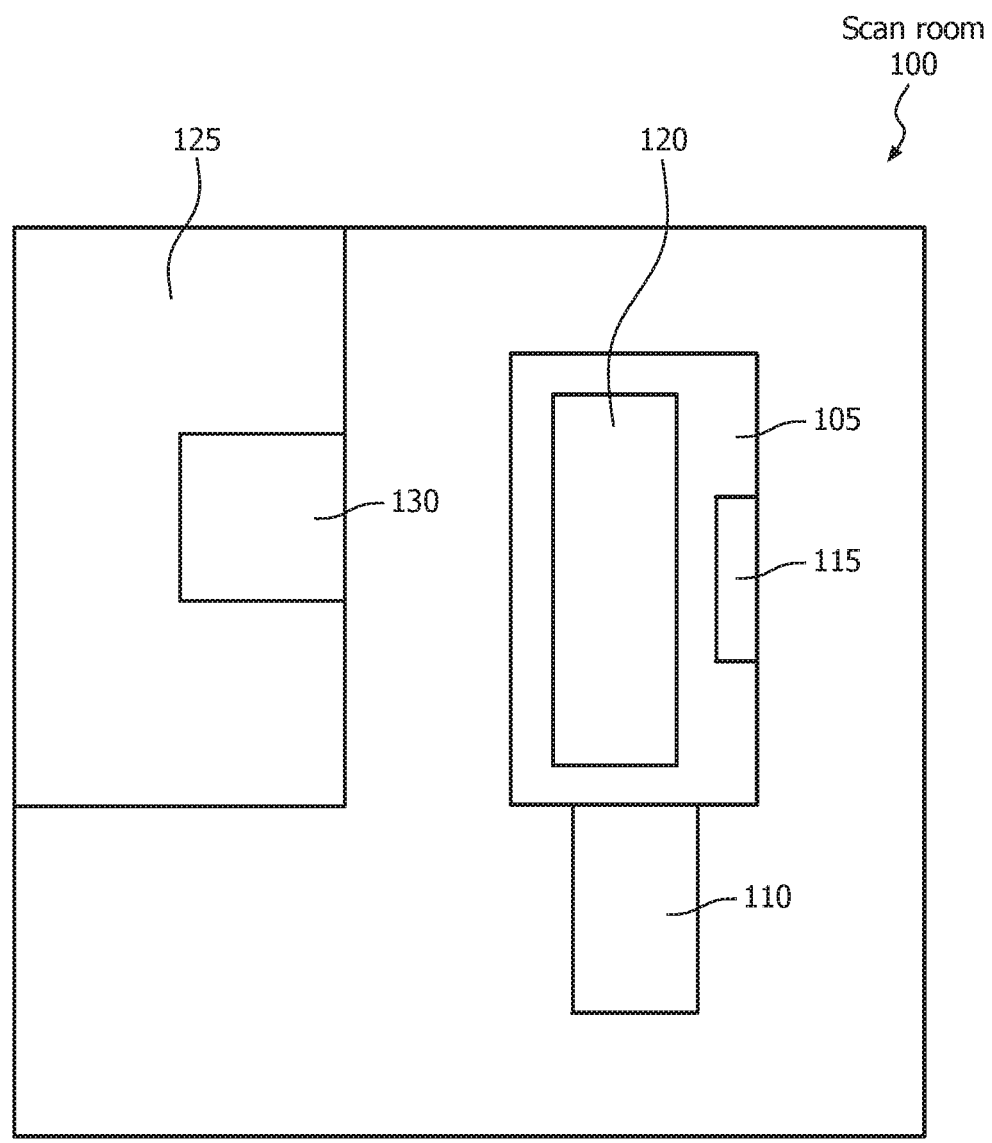
FIG. 1 shows a system for a scan room according to the exemplary embodiments.

The exemplary embodiments may be further understood with reference to the following description of the exemplary embodiments and the related appended drawings, wherein like elements are provided with the same reference numerals. The exemplary embodiments are related to a system and method of performing a MRI scan using a MRI device including wireless coils in which a digitizer clock of the MRI device is first analyzed based upon a system clock. Specifically, in a first mechanism, the digitizer clock may be analyzed to provide an indication as to a reliability of the MRI scans that would result based upon current conditions of the digitizer clock. In a second mechanism, the digitizer clock may be analyzed to provide a fixed signal to synchronize the digitizer clock with the system clock. The MRI procedure, the MRI device, the wireless capability, the digitizer and system clocks, the indication, the synchronization, and related methods will be explained in further detail below.

FIG. 1 shows a system for a scan room 100 according to the exemplary embodiments. The scan room 100 is used for a patient who requires an imaging to be performed. For example, the patient may require a MRI to be performed on a specific body portion. The scan room 100 includes a MRI device 105 which has a patient table 110, a control panel 115 and MRI components 120 as well as an operator room 125 including an imaging device 130.

According to the exemplary embodiments, the MRI device 105 may perform the scan on a patient lying on the patient table 110. Specifically, the MRI device 105 may utilize the MRI components 120 to perform the scan. The patient may be moved within a bore of the MRI device 105 via inputs received on the control panel 115. The control panel 115 may allow an operator to move the patient table 110 for an alignment to be performed where the patient table 110 is moved to the isocenter (the point in space through which the central beam of radiation is to pass).

The MRI components 120 may include a variety of components such as a magnet, gradient coils, radio frequency (RF) coils, and a RF detector. The magnet produces a strong magnetic field around an area to be imaged for the imaging procedure. This magnetic field allows nuclei (e.g., hydrogen nuclei of water molecules) to align with a direction thereof. The gradient coils may be disposed within the magnet to produce a gradient in the magnetic field in various directions (e.g., X, Y, and Z). The RF coil may be disposed within the gradient coils to produce a further magnetic field necessary to rotate the spins by various angles (e.g., 90°, 180°, etc.) selected by a pulse sequence. Thus, a radio frequency signal emitted by excited hydrogen atoms in the body may be detected using the energy from the oscillating magnetic field applied at the appropriate resonant frequency. The orientation of the image may be controlled by varying the magnetic field produced by the magnet using the gradient coils and a contrast between tissues is determined by a rate at which the excited nuclei return to an equilibrium state. Specifically, the RF detector may receive these energy measurements and provide the data to the imaging device 130 for processing to ultimately generate the images of the scan.

A conventional MRI device utilizes cable connections for the gradient and RF coils that are connected and reconnected when used. In contrast, the exemplary embodiments relate to utilizing the MRI device 105 in which wireless coils are used. Specifically, the cabling to the gradient and RF coils may be replaced with a wireless link. An example of such a wireless link may be a single frequency Multiple Input Multiple Output (MIMO) microwave link. The MRI components 120 of the MRI device 105 may include a frequency up-converter for each coil and an array of transceivers in the bore of the MRI device 105. Specifically, the MRI components 120 may be configured such that the transceivers are connected to an array of antennas that are integrated into the bore. The MRI components 120 may include a local oscillator that generates a signal in the transceivers that may feed the antenna array to illuminate the coil electronics. The signal from the local oscillator may also convert the microwave signals received from the coils back to the original selected magnetic resonance frequency. This may be packaged as the data to be received by the imaging device 130 for processing to generate the image from the scan.

In view of this wireless mechanism used by the MRI device 105, the signals transmitted to generate the data that the imaging device 130 bases the processing for image generation is subject to various interference and other effects that alter the reliability of the data. For example, as in any digital receiver systems, phase noise on the digitizer clock of the MRI device 105 may translate into reduced quality and/or reduced reliability of the reconstructed image. With particular regard to wireless coils in the MRI device 105, the digitizer clock is synchronized over a wireless channel with the risk of adding impairments to the clock signal. Those skilled in the art will understand that the digitizer clock provides a baseline in which the signals are propagated such that when the digitizer clock is out-of-sync with a system clock, the resulting data may become more unreliable as a higher discrepancy exists between the digitizer and system clocks. Therefore, the exemplary embodiments provide a mechanism to insure a quality of service by including hardware and/or software components to a digital receiver coil that enables measurement of a reference signal or a Received Phase Noise Indicator (RPNI) which is discussed in further detail below. As will become more evident below, the reference signal and the RPNI may be similar to a Received Signal Strength Indicator in wireless systems in functionality although more defined and specific to the wireless MRI device 105.

As those skilled in the art will recognize, MRI is an imaging method that uses frequency and phase encoding of protons (e.g., hydrogen nuclei in water molecules) for image reconstruction. In a particular example where synchronization of the digitizer clock may be highly relevant, phase noise on the digitizer clock may cause image artifacts due to the nature of the encoding method, particularly during long acquisitions/scans. Accordingly, it may be of importance to have the digitizer clock that minimizes a Root Mean Square (RMS) phase error on the digitized signal. For example, if the digitizer clock induced RMS phase error in the image raw data is to be set to below 1 degree, the RMS time jitter should preferably stay below 44 picoseconds (ps) at 64 MHz and below 22 ps at 128 MHz. As discussed above, the conventional MRI device may use a digitizer clock that is synchronized using wire or optical fiber to a highly stable system clock. However, with the wireless MRI device 105, the digitizer clock synchronization is performed wirelessly which poses the above issues, particularly with signal purity and subsequent reliability.

More specifically, the digitizer clock may be synchronized by transmitting a carrier signal as a pilot tone from the imaging device 130 to the MRI device 105. For example, the pilot tone may be the reference signal or the RPNI. The MRI device 105 may include circuitry within the MRI components 120 that amplifies the pilot tone which is then filtered and used to synchronize a Phase-Locked-Loop (PLL) circuit. The phase noise $\Phi r(t)$ of the recovered clock signal can be a combination of the phase noise $\Phi p(t)$ of the received pilot signal and the phase noise generated by the PLL. Any impairments in the channel or in the clock recovery circuit (e.g., PLL) may add phase noise to the recovered clock. Some of these impairments may be caused by patient motion (e.g., interference) or distortion of the wireless pilot tone channel. Other impairments may be due to hardware malfunction in the clock recovery unit. Any of these issues with digitizer clock synchronization may lead to poor and unreliable image quality and potential service calls/scanner down time. Early detection of poor phase noise performance may lead to early preventive and corrective actions to improve customer satisfaction of the MRI device 105. For example, the scanner personal/operator may be advised to monitor patient motion or field service may be informed regarding a deteriorating RPNI prior to image degradation.

According to the exemplary embodiments, the imaging device 130 may generate the RPNI and transmit it to the MRI device 105 to synchronize the digitizer clock. In a first manner, the MRI device 105 may include a mechanism that utilizes the reference signal to determine an accuracy of the digitizer clock by performing a calculation. The reference signal may be a signal based upon a system clock that forms a basis for synchronization. A result of this calculation may be a discrepancy that indicates whether the data provided by the MRI device 105 to the imaging device 130 is reliable for image generation. There may be predetermined thresholds for the discrepancy such that when beyond one of these thresholds, the MRI device 105 may be prevented from performing a scan when the image degradation would be too high and unacceptable. Accordingly, this first manner may relate to a relatively short-term mechanism. In a second manner, the MRI device 105 may include a mechanism that utilizes the RPNI by calculating a phase offset for the clock signal that will compensate the phase error due to, for example, variable time delays in the wireless channel. The reference signal may first be converted, transmitted, and returned as a return signal undergoing variable time delays which is processed to generate the RPNI. The imaging device 130 may subsequently calculate a clock phase offset that would synchronize the digitizer clock properly. Accordingly, this second manner may relate to long term phase stability between a system clock and a receiver clock.

Figure 2:
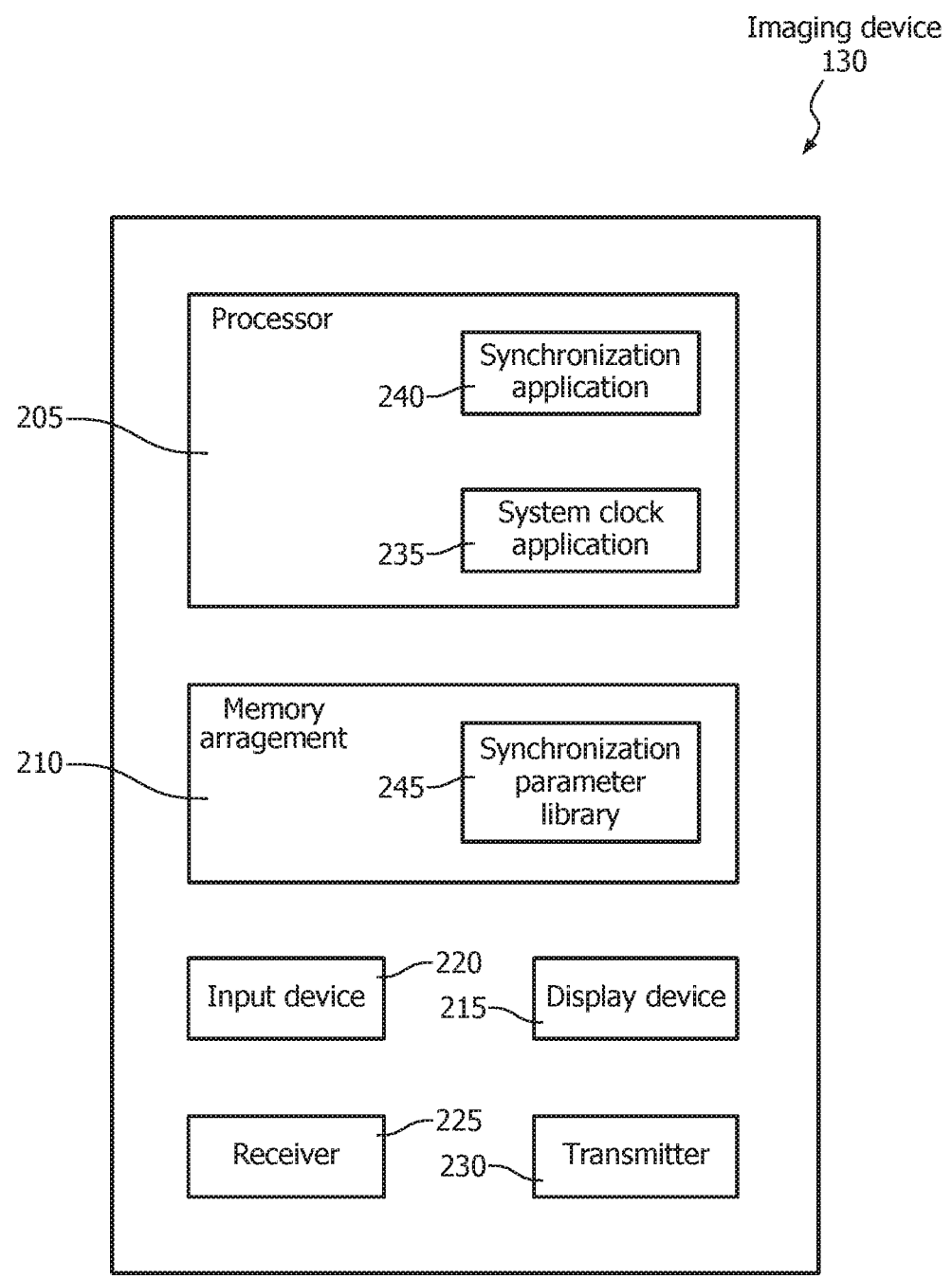
FIG. 2 shows an imaging device according to the exemplary embodiments.

FIG. 2 shows the imaging device 130 of FIG. 1 according to an exemplary embodiment. As discussed above, the imaging device 130 may be configured to communicate wirelessly with the MRI device 105. Accordingly, the imaging device 130 may include a receiver 225 and a transmitter 230. However, it should be noted that the imaging device 130 may include a combined transceiver to provide the functionalities of the receiver 225 and the transmitter 230. The receiver 225 and the transmitter 230 may be for a short range wireless communication since the imaging device 130 is often in close proximity to the MRI device 105 (e.g., both within the scan room 100). However, as will be described in an example below, the receiver 225 and the transmitter 230 may also be configured for long range wireless communications such as with a network.

Also as discussed above, the imaging device 130 may be configured to provide the RPNI that is used by the MRI device 105 to synchronize the digitizer clock. The imaging device 130 includes a processor 205 and a memory arrangement 210. The processor 205 may execute a system clock application 235 that maintains the system clock forming the basis on which the digitizer clock is synchronized. In a first manner, the system clock application 235 may be configured to solely maintain the system clock in a stable manner. In a second manner, the system clock application 235 may be configured to utilize the receiver 225 and the transmitter 230 that are capable of wireless communications to request a synchronization of the system clock. In either manner, the system clock may be maintained and used for synchronization functionalities.

The processor 205 may also execute a synchronization application 240. The synchronization application 240 may include a functionality to generate the RPNI based upon the system clock application 235. The RPNI may be generated by the synchronization application 240 and transmitted to the MRI device 105 via the transmitter 230. As will be described in further detail below, the synchronization application 240 may further generate a fixed RPNI that represents the long term phase drift between system clock and receiver clock. The fixed RPNI may be based upon the reference signal and information determined from a return signal provided by the MRI device 105 upon processing of the reference signal. The memory arrangement 210 may include a synchronization parameter library 245. The synchronization parameter library 245 may include pre-calculated parameters on which the reference signal is to be fixed to generate the RPNI. For example, the synchronization parameter library 245 may be a table of data from which the determined information provides the necessary operations to generate the RPNI. The synchronization parameter library 245 may be pre-programmed into the imaging device 130.

The imaging device 130 may also include a display device 215 and an input device 220. For example, the processor 205 may also execute an image generation application that utilizes the data received from the MRI device 105 (via the receiver 225) to generate the images of the scan. These images may be shown on the display device 215. The input device 220 may receive inputs from the operator to control operation of the MRI components 120 to select a slice to be scanned for the image to be generated.

Figure 3:
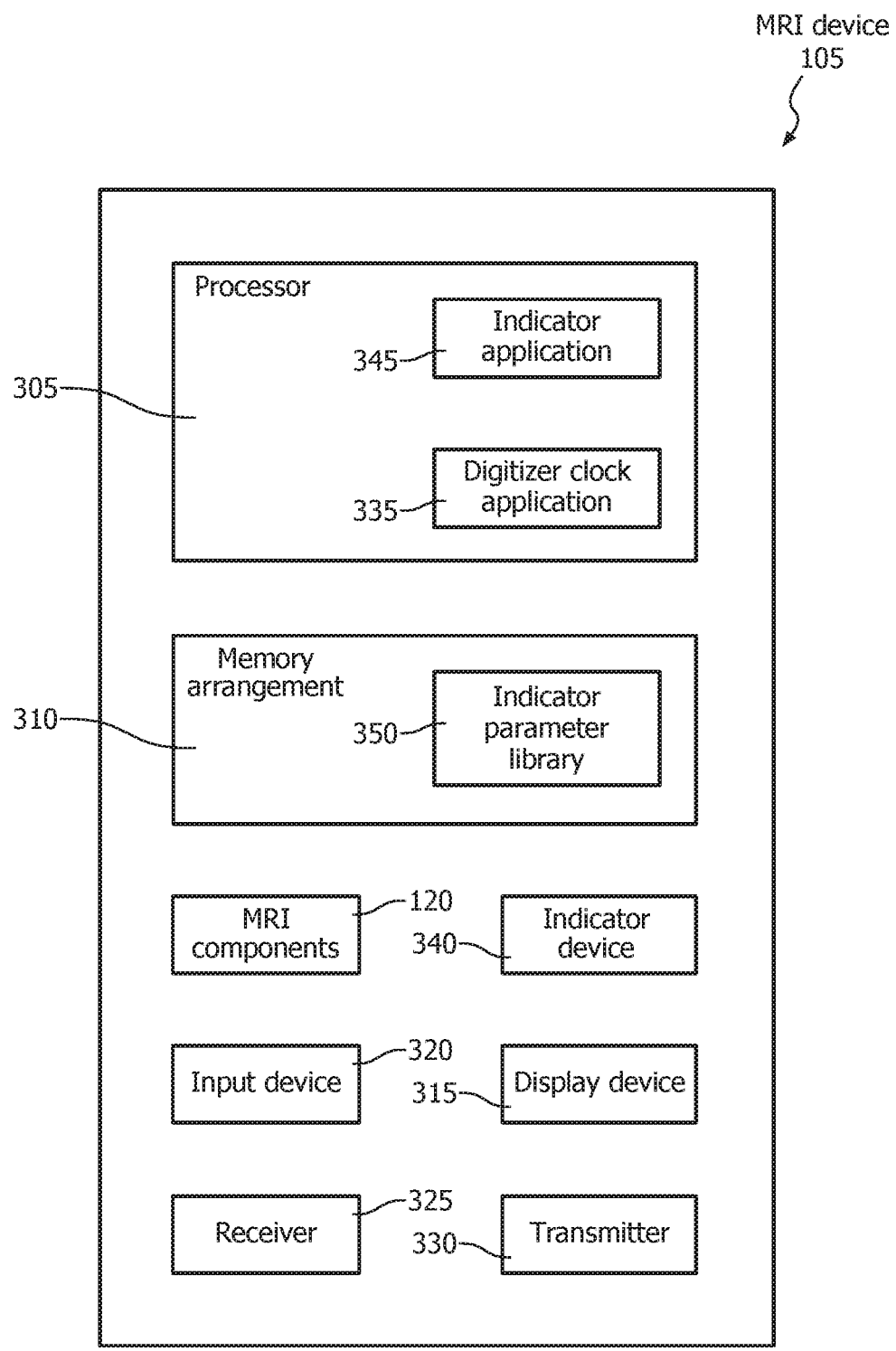
FIG. 3 shows a MRI device according to the exemplary embodiments.

FIG. 3 shows the MRI device 105 of FIG. 1 according to the exemplary embodiments. As discussed above, the MRI device 105 may be configured to communicate wirelessly with the imaging device 130. Accordingly, the MRI device 105 may include a receiver 325 and a transmitter 330. It should again be noted that the MRI device 105 may also include a combined transceiver to provide the functionalities of the receiver 325 and the transmitter 330. The receiver 325 and the transmitter 330 may be for a short range wireless communication with the imaging device 130. Although unlikely to require long range communication, the receiver 325 and the transmitter 330 may also be configured for this purpose.

Also as discussed above, the MRI device 105 may be configured to receive the RPNI from the imaging device 130 to compensate the phase offset between the digitizer clock and the system clock. The MRI device 105 includes a processor 305 and a memory arrangement 310. The processor 305 may execute a digitizer clock application 335 that maintains the digitizer clock and thus forming the basis on which signals and oscillations are controlled in the wireless gradient and RF coils. Thus, when the MRI device 105 receives the RPNI, the digitizer clock application 335 may apply the information thereof to correct the phase error between the digitizer clock and the system clock. The digitizer clock application 335 may further provide the return signal from processing the reference signal such that the RPNI may be received.

The processor 305 may also execute an indicator application 345. The indicator application 345 may operate in conjunction with the indicator device 340. As will be described in further detail below, the indicator device 340 may receive the reference signal to determine a discrepancy between the digitizer clock and the system clock. Depending on a result from the indicator device 340, the indicator application 345 may provide a corresponding indication as to a reliability of the data from performing a scan to generate the images on the imaging device 130.

The MRI device 105 may also include the MRI components 120, a display device 315, and an input device 320. For example, when moving the patient on the patient table 110 into the bore of the MRI device 105, the control panel 115 may include the display device 315 and the input device 320 for proper alignment with the isocenter.

Figure 4:
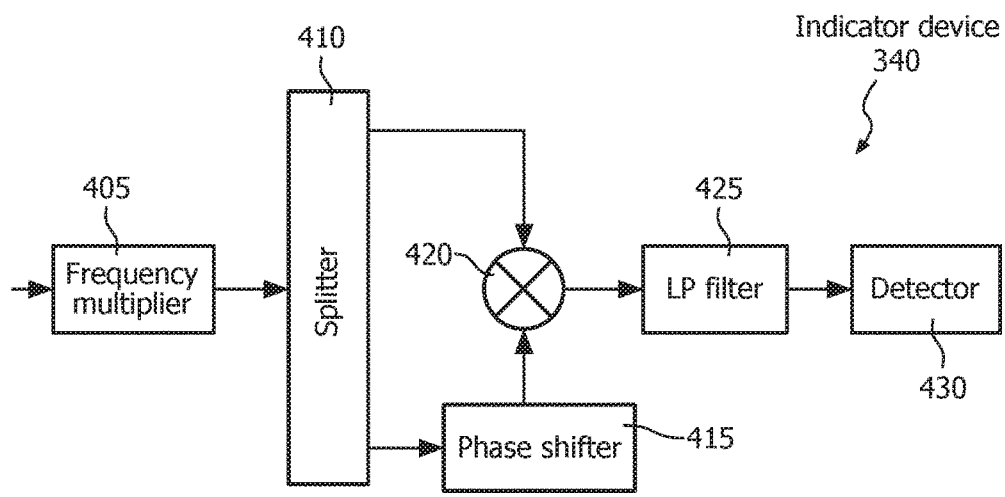
FIG. 4 shows an indicator device for generating an indication of a discrepancy in a digitizer clock of the MRI device according to the exemplary embodiments.

As discussed above, a first manner of utilizing the reference signal is for a relatively short-term mechanism. Specifically, the indicator device 340 may receive the reference signal to provide discrepancy information to the indicator application 345. It should be noted that the indicator device 340 is only exemplary and the MRI device 105 may include any combination of software and hardware to provide the indications described below. FIG. 4 shows the indicator device 340 of the MRI device 105 for generating an indication of a discrepancy in a digitizer clock of the MRI device according to the exemplary embodiments.

Those skilled in the art will understand that there are many ways to detect phase noise. A highly sensitive and accurate method may be implemented in phase noise test equipment when measuring phase noise in wireless systems that are designed for a highest phase noise sensitivity over a very large frequency range. As discussed above, when related to wireless coils in the MRI device 105, there are several differences between signals of wireless systems and wireless MRI devices such as the MRI device 105. For example, with wireless coils in the MRI device 105, the phase noise of a single sinusoidal signal is of interest. This signal is not even required to be the actual analog digital converter (ADC) clock signal itself but may also be a multiple in frequency. That is, when multiplying a frequency, the phase noise increases linearly with the product. For example, if a 50 MHz signal with a 1 degree jitter is multiplied by a factor of 10, a 500 MHz signal with a 10 degree jitter results. Thus, those skilled in the art will recognize that it is advantageous to measure the phase noise at a multiple of the clock frequency due to increased sensitivity.

The indicator device 340 may include components configured for this purpose. Specifically, the indicator device 340 may detect a discrepancy or a phase by multiplying a signal with an orthogonal signal of itself. Although the digitizer clock may be designed to identically follow the system clock, there is some discrepancy that results, particularly over a large period of time and/or with interference (e.g., a patient moving). When the digitizer clock is completely synchronized with the system clock where there is no jitter, a product of an orthogonal signal to an original signal results as zero indicating no discrepancy. For example, with oscillations, a pure sine wave is exhibited such that an orthogonal signal is a pure cosine wave where the two waves negate each other. However, when a discrepancy exists, the sine wave is altered so that the orthogonal signal results in some non-zero value.

To accomplish this, the indicator device 340 includes a frequency multiplier 405 that receives the reference signal. It should be noted that the frequency multiplier 405 is only exemplary and is not required. The reasons for including a frequency multiplier were discussed above. Subsequently, the signal is sent to a splitter 410 that generates a first signal that is sent to a multiplier 420 and a second identical signal that is sent to a phase shifter 415. To reach the orthogonal signal, the phase shifter 415 may shift the phase by 90 degrees. The phase shifter 415 sends the orthogonal signal to the multiplier 420. After multiplying, the result is sent to a low pass (LP) filter 425 such that the multiplied frequency signal is attenuated for the detector 430 to output the discrepancy value. Again, if the signal and the orthogonal signal are truly orthogonal (i.e., no jitter), then the product is zero. However, if there is any jitter on the reference signal, then it causes a residual signal that is indicative of the received phase noise.

The indicator application 345 of the MRI device 105 may receive the residual signal from the indicator device 340. Referring to the indicator parameter library, the indicator application 345 may determine a reliability of the data obtained from performing a scan. The indicator parameter library may define a plurality of ranges in which the discrepancy corresponds from the residual signal. In a first range from zero to a first value, the residual signal may be sufficiently negligent that the reliability of the data is satisfactory for image generation. In a second range from the first value to a second value, the residual signal may be sufficiently large to affect the image generation. In such a scenario, the indicator application 345 may provide an indication on the display device 215 and/or 315 that the data may be not as reliable compared to when the residual signal is within the first range. In a third range from the second value to a maximum value, the residual signal may be sufficiently adverse that the image generation is unreliable. In such a scenario, the indicator application 345 may provide an indication on the display device 215 and/or 315 that the data may be unreliable. The indicator application 345 may also perform other functionalities. For example, the indicator application 345 may transmit a signal that deactivates the MRI device 105. In another example, the indicator application 345 may transmit a notification to a technician to address the discrepancy.

It should be noted that the relatively short-term mechanism of the first manner may be utilized in a variety of ways. For example, this manner provides a cost efficient way of determining phase noise. The indicator device 340 and/or the indicator application 345 may be incorporated within the MRI device 105 or may be modular and separately connected to the MRI device 105. Accordingly, the first manner may be easily incorporated into a MRI device using wireless coils that does not already have a wireless synchronization functionality. Through the first manner, a wired connection may subsequently be utilized when the residual signal indicates a need for synchronization of the digitizer clock. In another example, this may be used in conjunction with the second manner which is described below.

Figure 5:
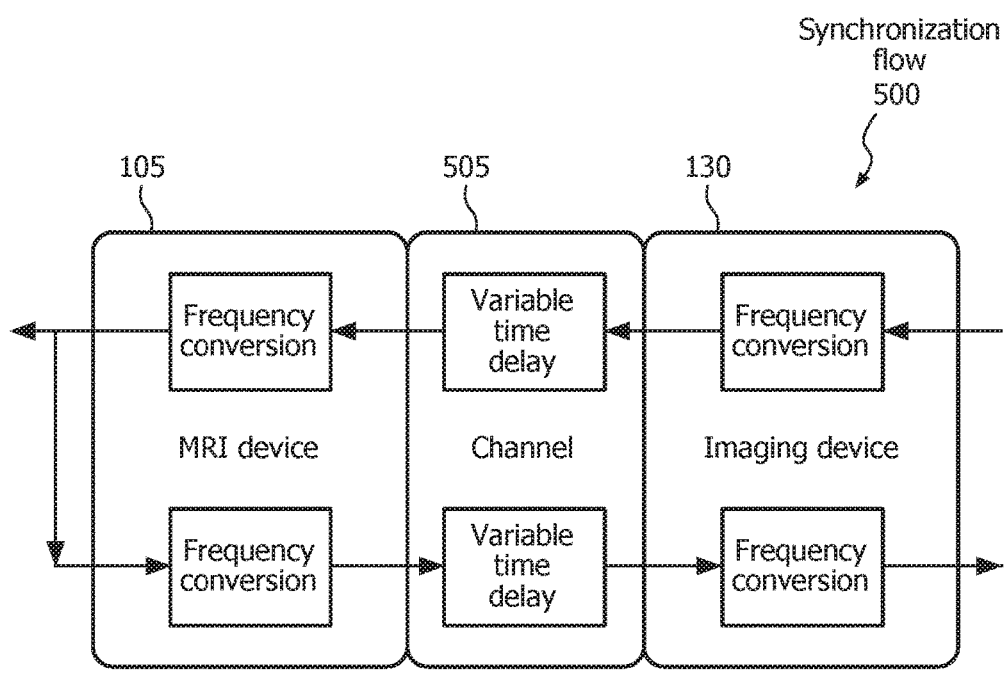
FIG. 5 shows a synchronization flow for adjusting a digitizer clock of the MRI device according to the exemplary embodiments.

As discussed above, a second manner of utilizing the RPNI is for a relatively long-term mechanism. Specifically, the synchronization application 240 may transmit the reference signal to receive a return signal from the MRI device 105 to determine the RPNI that synchronizes the digitizer clock of the MRI device 105 to the system clock of the imaging device 130. It should be noted that the imaging device 130 is only exemplary and this component or any other component may be used to provide the functionalities described below. FIG. 5 shows a synchronization flow 500 for adjusting a digitizer clock of the MRI device 105 according to the exemplary embodiments. It should also be noted that the synchronization flow 500 is also only exemplary and any operation to determine a fix for the reference signal to generate the RPNI may be used. For example, a more specified embodiment for the synchronization flow will be described below with regard to FIG. 8.

The synchronization flow 500 utilizes a round trip phase error correction. Being a round trip, any variable phase error across a channel 505 between the imaging device 130 and the MRI device 105 appears twice during a round trip of the reference signal. Thus, a measurement of the phase drift of the round trip signal at the imaging device 130 and halving it provides information about the phase drift at the MRI device 105. This information may subsequently be used in generating the RPNI to correct any phase error due to the digitizer clock of the MRI device 105 not being synchronized with the system clock.

The system clock application 235 of the imaging device 130 may include a frequency conversion functionality whereas the digitizer clock application 335 of the MRI device 105 may include an opposing frequency conversion functionality. As discussed above, the MRI device 105 may include a PLL that utilizes a reference signal to generate a multiple of that frequency that may also be divided down. Accordingly, the frequency conversion functionality may include first multiplying the reference signal with a first value to obtain a first result signal and second dividing the first result with a second value to obtain a second result signal. This second result signal may be output and transmitted via the transmitter 230 of the imaging device 130. The second result signal may travel through the channel 505 in which a variable time delay becomes incorporated into the output to obtain an altered second result signal. The variable time delay may include a variety of components. For example, the variable time delay may include a delay added by the channel 505, a drift error added to the signal, a combination thereof, etc.

When attempting to synchronize the digitizer clock, the MRI device 105 may perform the opposing frequency conversion functionality on the received altered second result signal. Thus, the opposing frequency conversion functionality may include first multiplying the altered second result signal by the second value to obtain a third result signal and dividing the third result signal by the first value to obtain a fourth result signal. The fourth result signal may be used by the digitizer clock application to synchronize the digitizer clock.

However, the exemplary embodiments may provide for the altered second result signal to have a further frequency conversion operation performed thereon. Specifically, the altered second result signal is multiplied by a third value to obtain a fifth result signal and divided by a fourth value to obtain a sixth result signal. The sixth result signal may travel through the channel 505 in which the variable time delay again becomes incorporated into the output to obtain an altered sixth result signal. In this manner, the variable time delay has been added twice in the round trip.

The imaging device 130 may process the altered sixth result signal to determine a fix to be applied to the RPNI for the digitizer clock to be synchronized with the system clock. That is, the fix may eliminate any jitter, phase error, etc. Specifically, halving the resulting variable time delay provides the necessary information to the synchronization application 240 to determine the fix. The RPNI that was originally transmitted may be sufficient when a wired connection is available. However, with the introduction of the variable time delay, the synchronization application 240 may generate the RPNI that considers the variable time delay such that even after the variable time delay is experienced in the channel 505, the digitizer clock application 335 may utilize the RPNI to synchronize the digitizer clock with the system clock.

In a specific embodiment, a reference signal $\sin(\omega_0 \cdot t)$ may undergo the frequency conversion to result in an output signal $$\sin\left(\frac{A}{B}\omega_0 \cdot t + \varphi_1\right)$$

by the imaging device 130. After traveling through the channel 505, the MRI device 105 may be provided a received signal $$\sin\left(\frac{A}{B}\omega_0 \cdot (t - t_c - \Delta t) + \varphi_1\right)$$

where the variable time delay includes a channel delay $l_c$ and a drift error $\Delta t$. The MRI device 105 may perform the further frequency conversion operation on the received signal to generate a further output signal $$\sin\left(\frac{A}{B}\frac{C}{D}\omega_0 \cdot (t - t_c - \Delta t) + \frac{C}{D}\varphi_1 + \varphi_2\right)$$

by the MRI device 105. After traveling through the channel 505, the imaging device 130 may be provided a further received signal $$\sin\left(\frac{A}{B}\frac{C}{D}\omega_0 \cdot (t - 2t_c - 2\Delta t) + \frac{C}{D}\varphi_1 + \varphi_2\right)$$

with the same variable time delay. After performing an opposite frequency conversion on the further frequency conversion operation performed by the MRI device 105, an output signal $$\sin\left(\omega_0 \cdot (t - 2t_c - 2\Delta t) + \frac{B}{A}\varphi_1 + \frac{B}{A}\frac{D}{C}\varphi_2\right)$$

may be obtained. This output signal may provide the basis for determining the fix to be applied to the RPNI signal to generate the RPNI signal transmitted to the MRI device 105. As described above, the RPNI signal may have an opposing frequency conversion operation performed thereon to determine the manner in which to synchronize the digitizer clock with the system clock.

Figure 8:
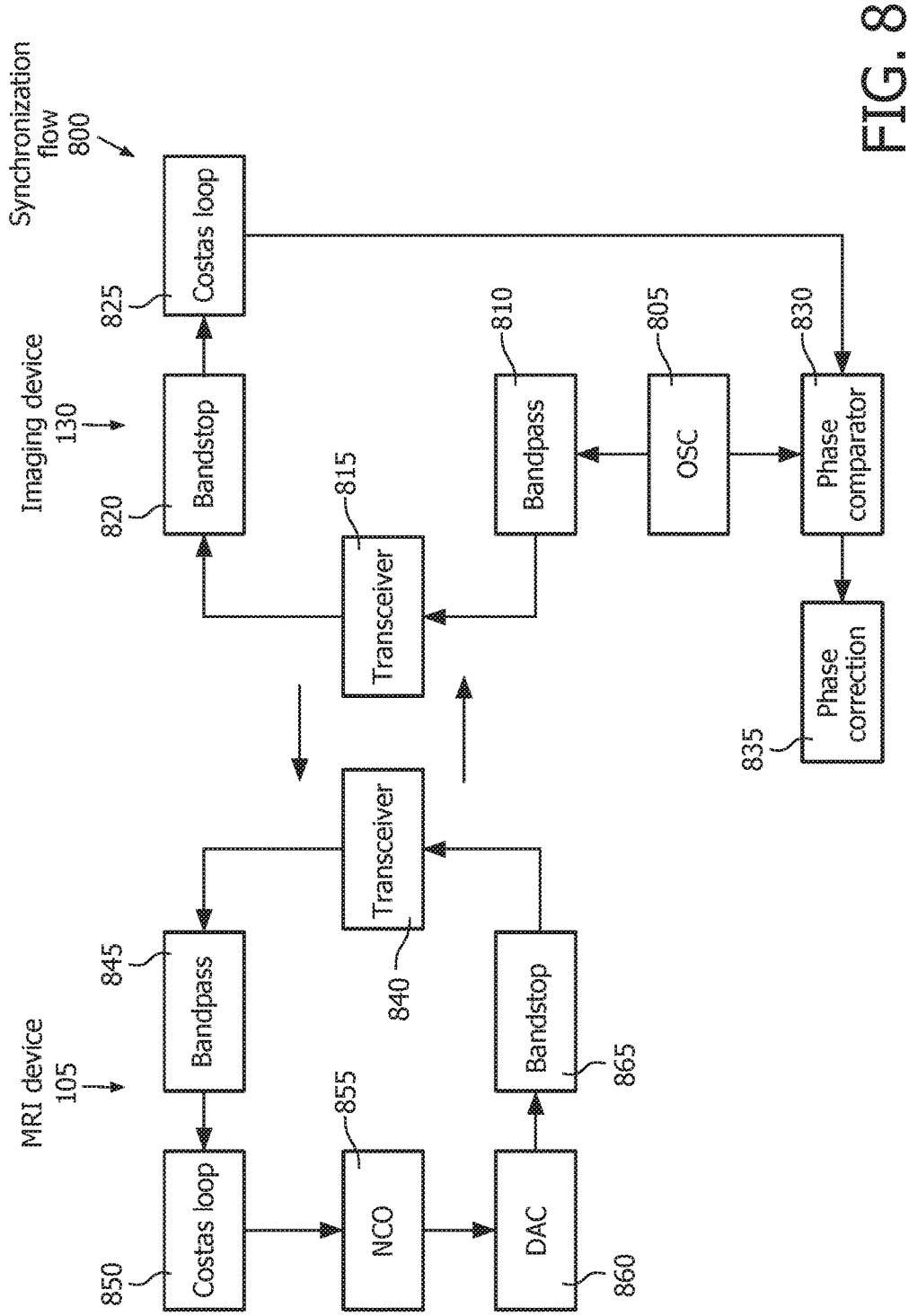
FIG. 8 shows a specific synchronization flow for adjusting a digitizer clock of the MRI device according to the exemplary embodiments.

As discussed above, FIG. 8 is a particular embodiment for the synchronization filter and accompanying components. Specifically, FIG. 8 shows a specific synchronization flow 800 for adjusting a digitizer clock of the MRI device 105 according to the exemplary embodiments. In a substantially similar manner as the synchronization flow 500 of FIG. 5, the synchronization flow 800 relates to a round trip phase error correction. That is, a signal may be generated from an imaging device 130 that is received by the MRI device 105 in which the MRI device 105 "processes" the signal to generate a return signal. The return signal may be used by the imaging device 130 to determine a phase correction to be applied for any signals transmitted from the imaging device 130 to the MRI device 105. Specifically, the above mechanism described with regard to the synchronization flow 500 may again be utilized with respect to the synchronization flow 800.

As illustrated, the synchronization flow 800 may again include the imaging device 130 and the MRI device 105. Although the imaging device 130 and the MRI device 105 and corresponding components were described above, the synchronization flow 800 again describes these components but with regard to the particular embodiment herein. Thus, the imaging device 130 may include an oscillator (OSC) 805, a bandpass filter 810, a transceiver 815, a bandstop filter 820, a Costas loop 825, a phase comparator 830, and a resulting phase correction value 835. The MRI device 105 may include a transceiver 840, a bandpass filter 845, a Costas loop 850, a numerically controlled oscillator (NCO) 855, a digital to analog converter (DAC) 860, and a bandstop filter 865.

Those skilled in the art will understand the functionalities associated with the components of the imaging device 130 and the MRI device 105. For example, the bandpass filter may be a device that passes frequencies within a predetermined range and rejects other frequencies whereas the bandstop filter provides a substantially opposite functionality. In another example, the Costas loop may be a particular PLL based circuit used for carrier phase recovery from suppressed-carrier modulation signals. In a further example, the NCO may be a digital signal generator creating a synchronous, discrete-time, discrete-valued representation of a waveform (e.g., sinusoidal).

As illustrated, the OSC 805 may be predefined to generate signals at a specified frequency such as 10 MHz. Initially, this 10 MHz signal may be fed to the bandpass filter 810 prior to transmission by the transceiver 815 to the imaging device 105. Thus, the transceiver 840 of the MRI device 105 may receive a signal from the imaging device 130 at 10 MHz. The received 10 MHz signal may pass through the bandpass filter 845 prior to processing at the Costas loop 850. Once processed, the signal may be fed to the NCO 855. The NCO 855 may output an effected signal such as one that may be ±1 MHz above and below the incoming 10 MHz signal. That is, the DAC 860 may receive a 9 MHz and a 11 MHz signal. These signals may be provided to the bandstop filter 865 prior to transmission by the transceiver 840 back to the imaging device 130. This way, both signals propagating through the channel, from transceiver 815 to transceiver 840, and vice versa from transceiver 840 to transceiver 815, are centered on 10 MHz, and therefore both signals will experience the same channel delay that corresponds to the variable channel property for that frequency.

When the imaging device 130 receives the return signals at 9 MHz and 11 MHz from the MRI device 105 via the transceiver 815, these signals may initially go through the bandstop filter 820 prior to processing at the Costas loop 825. The phase comparator 830 may receive the output from the Costas loop 825 as well as receive the original signal from the oscillator 805 which may serve as a reference to determine the phase correction value 835. In this manner, the phase correction value 835 may be determined which may be used to synchronize the digitizer clock with the system clock.

Figure 6:
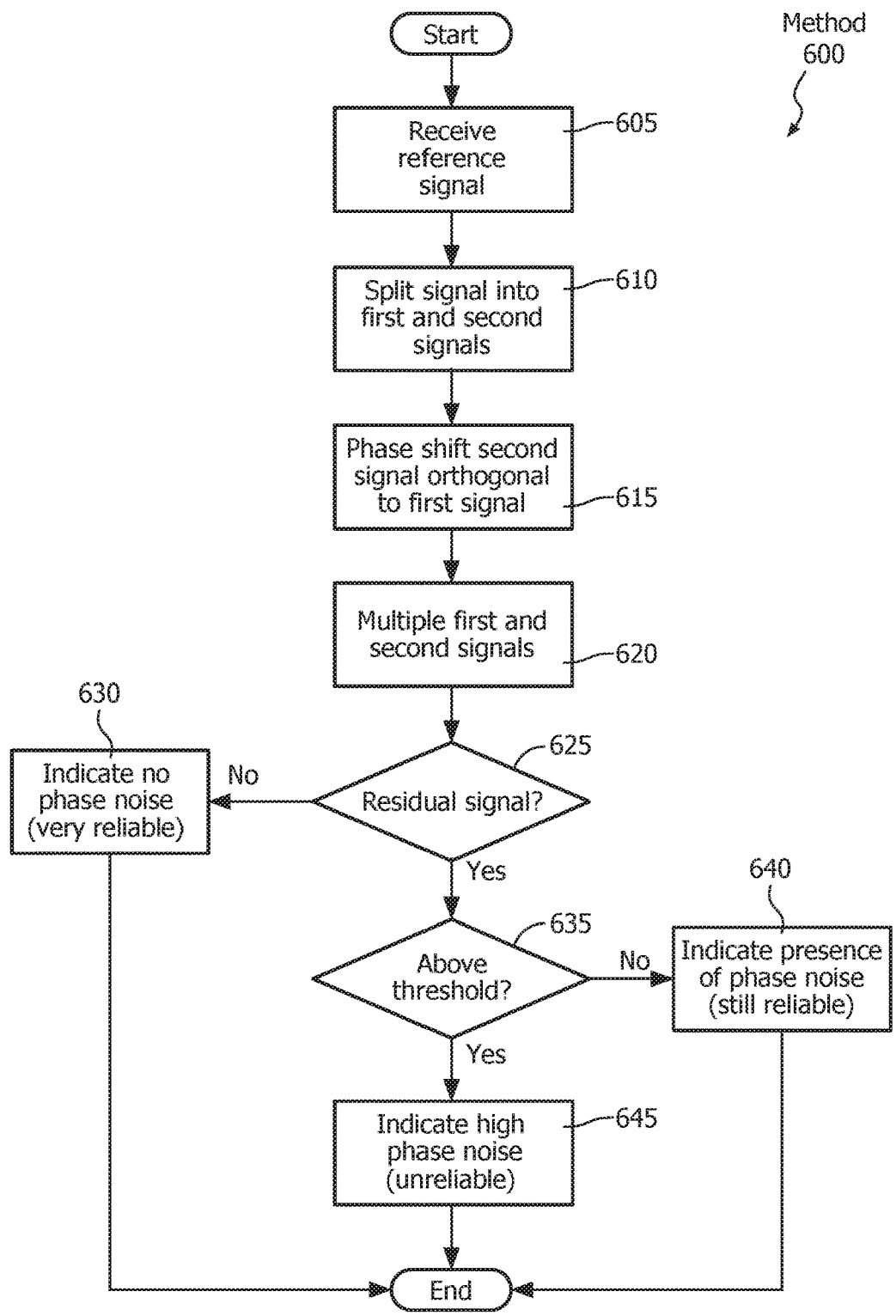
FIG. 6 shows a method of indicating a discrepancy in a digitizer clock of the MRI device according to the exemplary embodiments.

FIG. 6 shows a method 600 of indicating a discrepancy in a digitizer clock of the MRI device 105 according to the exemplary embodiments. The method 600 relates to the first manner in which a relatively short-term mechanism is provided to generate an indication of a reliability of the data obtained from performing a scan based upon current conditions existing on the digitizer clock. The method 600 will be described with regard to the MRI device 105, the indicator device 340, and the indicator application 345.

In step 605, the MRI device 105 receives a reference signal. Specifically, via the receiver 325, the frequency multiplier 405 of the indicator device 340 receives the reference signal. In step 610, the frequency multiplied reference signal is split into two identical signals, a first one being sent to the multiplier 420. In step 615, the second split signal is sent to the phase shifter 415 such that the phase is shifted orthogonal to the original signal. As discussed above, the phase shifter 415 may have various values such as $\pi/2+N*\pi$, where N is a positive integer in which a larger the value N results in a longer time delay between the two signals. In this manner, different parts of the phase noise spectrum may be tested. However, it should be noted that it may be difficult to generate significantly long phase delays between the two split signals, in particular, phase drift that happens over long periods of time (e.g., seconds to minutes) may require a different mechanism. Such a different mechanism may be the probing the long term phase drift, a method for which is discussed in further detail below as a roundtrip phase error compensation. In step 620, the orthogonal signal is also sent to the multiplier such that the original signal and the orthogonal signal are multiplied. Subsequently, the output may be sent to the LP filter 425 and the detector 430.

In step 625, the indicator application 345 receives the product and determines if there is a residual signal. As discussed above, if the digitizer clock is properly synchronized with the system clock where there is no jitter, the product results as zero. Thus, when there is no residual signal, the indicator application 345 continues the method 600 to step 630 where an indication of no phase noise is provided, for example, on the display device 215 and/or 315. Such an indication may indicate that the data used to generate the images is very reliable.

Returning to step 625, if the indicator application 345 determines that there is a residual signal, it continues the method 600 to step 635. In step 635, the indicator application 345 determines whether the residual signal is above a predetermined threshold that may be stored in the indicator parameter library 350. If the residual signal exists but is below the predetermined threshold, the indicator application 345 continues the method 600 to step 640. In step 640, the indicator application 345 provides an indication that there is a phase noise but is within acceptable limits where the data used to generate the image is still reliable. However, if the residual signal exists and is above the predetermined threshold, the indicator application 345 continues the method 600 to step 645. In step 645, the indicator application 345 provides an indication that there is sufficient phase noise that the data used to generate the image is unreliable.

It should be noted that the method 600 may include further steps. For example, as discussed above, when the indication of phase noise in the residual signal is above the predetermined threshold, the indicator application 345 may perform a variety of subsequent actions such as deactivating the MRI device 105, contacting a technician, etc. In another example discussed above, there may be multiple thresholds for the residual signal.

Figure 7:
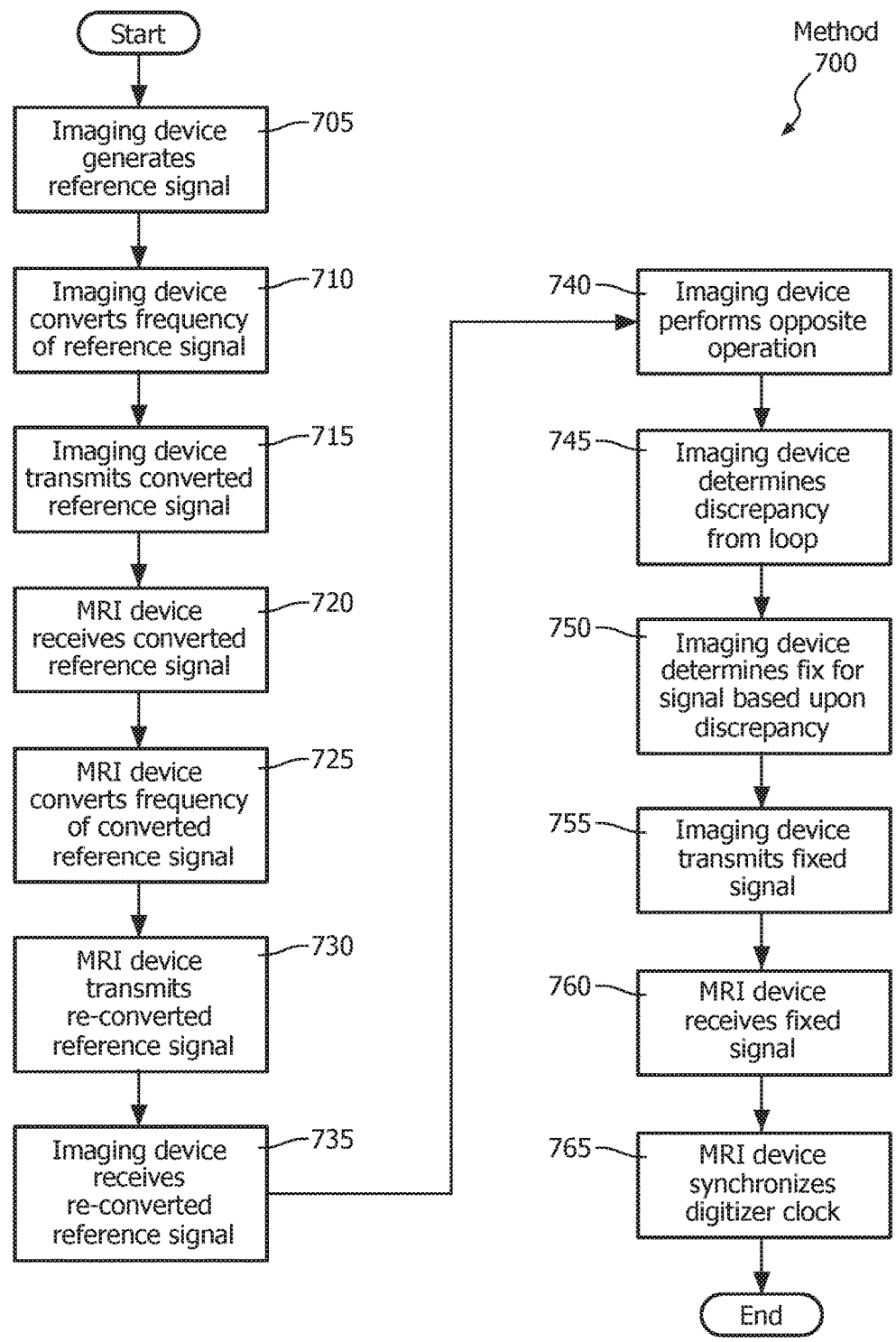
FIG. 7 shows a method of adjusting a digitizer clock of the MRI device according to the exemplary embodiments.

FIG. 7 shows a method 700 of adjusting a digitizer clock of the MRI device 105 according to the exemplary embodiments. The method 700 relates to the second manner in which a relatively long-term mechanism is provided to generate a fixed RPNI signal that synchronizes the digitizer clock with the system clock such that data obtained from performing a scan is reliable in generating images. The method 700 will be described with regard to the MRI device 105 and the imaging device 130.

In step 705, the imaging device 130 generates a reference signal based upon the system clock maintained by the system clock application 235. Specifically, the synchronization application 240 may generate the reference signal. In step 710, the synchronization application 240 converts the frequency of the reference signal. As discussed above, the frequency conversion operation may entail first multiplying by a first factor and then dividing by a second factor as done with a PLL. In step 715, the imaging device 130 transmits the converted reference signal via the transmitter 230 to the MRI device 105.

During transmission, the converted reference signal may undergo a variable time delay in the channel 505. As discussed above, such a variable time delay may include a channel delay, a drift error, etc. Thus, the converted reference signal may have been transmitted in a first way but is received in a second way. Thus, in step 720, the MRI device 105 receives the converted reference signal that underwent the variable time delay via the receiver 325. In step 725, the digitizer clock application 335 of the MRI device 105 converts the delayed converted reference signal. As discussed above, the further frequency conversion operation may entail first multiplying by a third factor and then dividing by a fourth factor. In step 730, the MRI device 105 transmits the re-converted reference signal via the transmitter 330 to the imaging device 130.

During transmission, the re-converted reference signal may again undergo the variable time delay in the channel 505. Thus, the re-converted reference signal may have been transmitted in a first way but is received in a second way. Thus, in step 735, the imaging device 130 receives the re-converted reference signal that underwent the variable time delay via the receiver 225. Specifically, the variable time delay has been applied twice. In step 740, the imaging device 130 performs an opposing frequency conversion for all the conversions.

In step 745, the imaging device 130 determines a discrepancy from the reference signal being transmitted over the loop. Specifically, the discrepancy may be based upon half of a total variable time delay applied in the received return signal. In step 750, the imaging device 130 determines a fix to be applied on the reference signal such that the variable time delay is negated when transmitted to the MRI device 105. That is, the synchronization application 240 generates the RPNI. In step 755, the imaging device 130 transmits the RPNI to the MRI device 105. In step 760, the MRI device 105 receives the RPNI that underwent the variable time delay in the channel 505. It should be noted that the imaging device may alternatively use the RPNI and correct the phase offset of the actual MRI data when the MRI data is transmitted from the MRI device 105 to the imaging device 130. Nevertheless, the RPNI is configured for this variable time delay. Thus, in step 765, the digitizer clock application 335 of the MRI device 105 synchronizes the digitizer clock with the system clock.

According to the exemplary embodiments, the system and method of the exemplary embodiments provide a mechanism in a MRI device utilizing wireless coils to process a reference signal from an imaging device. The MRI device may process the reference signal to determine a discrepancy between a system clock and a digitizer clock such as inclusion of jitter. The discrepancy may be used as a basis to generate an indication of reliability of data obtained from performing a scan to generate images. The MRI device may also process the reference signal through frequency conversions and provide a return signal to the imaging device. Using a round trip loop and experiencing a variable time delay twice from first traveling through a channel from the imaging device to the MRI device and then traveling again through the channel from MRI device to the imaging device, the imaging device may generate a received phase noise indicator signal based upon the determined delay such that the digitizer clock may be properly synchronized and phase aligned with the system clock. In this manner, the data obtained from performing the scan may be more reliable in generating images.

Those skilled in the art will understand that the above described exemplary embodiments may be implemented in any number of manners, including, as a separate software module, as a combination of hardware and software, etc. For example, the generation of the model of the patient may be a program containing lines of code that, when compiled, may be executed on a processor.

It will be apparent to those skilled in the art that various modifications may be made in the present invention, without departing from the spirit or the scope of the invention. Thus, it is intended that the present invention cover modifications and variations of this invention provided they come within the scope of the appended claims and their equivalent.

What is claimed is:

1. A method, comprising:
   receiving, by a Magnetic Resonance Imaging (MRI) device, an original reference signal from an imaging device, the MRI device utilizing wireless coils propagating image signals based upon a digitizer clock to obtain image data used by the imaging device to generate a MRI image, the original reference signal generated based upon a system clock by which the image signals are desired to be propagated;
   splitting, by the MRI device, the original reference signal into first and second reference signals;
   phase shifting, by the MRI device, the second reference signal to generate an orthogonal reference signal; determining, by the MRI device, a product between the first reference signal and the orthogonal reference signal; and
   determining, by the MRI device, an indication indicating a reliability of the image data based upon the product.

2. The method of claim 1, wherein the product is zero and the indication is for a first reliability value indicating the MRI image is accurately generated based upon the image data.

3. The method of claim 2, wherein the product is greater than zero but lower than a predetermined threshold and the indication is for a second reliability value lower than the first reliability value.

4. The method of claim 3, wherein the product is greater than the predetermined threshold and the indication is for a third reliability value lower than the second reliability value.

5. The method of claim 1, wherein the reference signal is received through a channel in which the reference signal is transmitted from the imaging device in a first form and received by the MRI device in a second form.

6. The method of claim 5, wherein an impairment of the channel is based upon motion of a patient in a bore of the MRI device.

7. The method of claim 5, wherein an impairment of the channel is based upon a distortion of the channel.

8. The method of claim 1, further comprising:
   prior to the splitting,
   multiplying, by the MRI device, a frequency of the reference signal to increase a sensitivity in the determining of the indication.

9. The method of claim 8, further comprising:
   prior to the determining of the product,
   low-pass filtering, by the MRI device, the multiplied frequency to attenuate the reference signal.

10. A Magnetic Resonance Imaging (MRI) device, comprising:
    a digitizer clock;
    wireless coils propagating image signals based upon the digitizer clock to obtain image data;
    a receiver configured to receive an original reference signal from an imaging device, the original reference signal being generated based upon a system clock by which the image signals are desired to be propagated; and
    a processor configured to:
    split the original reference signal into first and second reference signals;
    phase shift the second reference signal to generate an orthogonal reference signal;
    determine a product between the first reference signal and the orthogonal reference signal; and
    determine an indication indicating a reliability of the image data based upon the product.

* * * * *